(12) United States Patent
Hawkins et al.

(10) Patent No.: US 8,330,447 B2
(45) Date of Patent: *Dec. 11, 2012

(54) SELF-BALANCING FREQUENCY DETERMINING BRIDGE

(75) Inventors: Richard R. Hawkins, Santa Rosa, CA (US); Jon R. Sigler, Santa Rosa, CA (US)

(73) Assignee: Ladybug Technologies, LLC, Santa Rosa, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/016,716

(22) Filed: Jan. 28, 2011

(65) Prior Publication Data

US 2011/0128034 A1 Jun. 2, 2011

Related U.S. Application Data

(63) Continuation of application No. 12/443,119, filed as application No. PCT/US2007/079553 on Sep. 26, 2007, now Pat. No. 7,884,596.

(60) Provisional application No. 60/826,969, filed on Sep. 26, 2006.

(51) Int. Cl.
*G01R 17/02* (2006.01)
(52) U.S. Cl. ............... 324/98; 324/706; 324/725
(58) Field of Classification Search .............. None
See application file for complete search history.

(56) References Cited

U.S. PATENT DOCUMENTS

| | | | | |
|---|---|---|---|---|
| 3,852,662 A * | 12/1974 | Katz | ............. | 324/234 |
| 3,944,792 A | 3/1976 | Sautner | | |
| 5,801,525 A | 9/1998 | Oldfield | | |
| 6,486,679 B1 * | 11/2002 | Holt | ............. | 324/610 |
| 6,496,680 B2 | 12/2002 | Fujimoto | | |
| 6,853,176 B2 | 2/2005 | Lymer | | |
| 7,884,596 B2 * | 2/2011 | Hawkins et al. | ............. | 324/98 |

* cited by examiner

*Primary Examiner* — Minh N Tang
(74) *Attorney, Agent, or Firm* — Craig M. Stainbrook; Stainbrook & Stainbrook, LLP

(57) ABSTRACT

A self-balancing Wheatstone bridge that provides frequency and power information. The frequency information obtained can be applied to correct the power measurement to provide excellent match, excellent frequency insensitivity, good dynamic range, good frequency range, and adequate frequency accuracy. The system is highly responsive, simple, and cost effective.

8 Claims, 6 Drawing Sheets

SELF-BALANCING FREQUENCY DETERMINING BRIDGE

CROSS REFERENCES TO RELATED APPLICATIONS

The present application is a continuation of U.S. Utility patent application Ser. No. 12/443,119, filed Mar. 26, 2009, now U.S. Pat. No. 7,884,596, issued Feb. 8, 2011, which application was submitted under 35 U.S.C. 371 based on PCT/US07/79553, filed Sep. 26, 2007, which, in turn, claims the benefit of U.S. Provisional Patent Application Ser. No. 60/826,969, filed Sep. 26, 2006.

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION-BY-REFERENCE OF MATERIAL SUBMITTED ON A COMPACT DISC

Not applicable.

BACKGROUND OF THE INVENTION

1. Field of the Invention

The present invention relates generally to radio frequency and microwave power measurements, and more particularly to a circuit providing automatic frequency determination with power measurements in which frequency data obtained can be used to correct the power measurements.

2. Discussion of Related Art Including Information Disclosed Under 37 CFR §§1.97, 1.98

When making RF and microwave power measurements the user typically must perform two or three operations, depending on the type of sensor: First, the user must zero the sensor; second, with some meters the user must calibrate the sensor; and third, the user makes a measurement. The user then must apply frequency correction (calibration factor) to the measurement. In older meters the user reads the calibration factor from a table or graph and then selects the calibration factor on the meter. Newer power meters allow the user to enter the frequency directly. The power meter firmware then selects the calibration factor for the user.

There has been at least one departure from this sequence. In the early to mid 1980's, the Hewlett-Packard Company created the HP8902A. The HP8902A combined in a single instrument a modulation analyzer, a power meter, and a very sensitive synchronous receiver/detector. This instrument was able to make frequency-corrected RF power measurements from +20 dBm to −120 dBm. However the meter still needed to be zeroed and calibrated by the user. The present inventors believe that this instrument was the first to measure the frequency automatically and then to automatically apply the power meter correction factors for the user. This was done by placing an RF switch, the essence of an HP8478A power sensor, and sufficient memory to hold the calibration factors for the sensor in a single unit.

This single unit was an HP11792A. The HP11792A connected directly to the HP8902A via two cables. The RF switch in the HP11792A provided two paths. One path routed the incoming signal to the power sensor through one cable. The second path routed the RF power to the modulation analyzer portion of the instrument.

When automatic measurements were made the switch routed the RF signal first to the modulation analyzer which measured the frequency. Then the switch in the HP11792A was set to route the RF signal directly to the HP8478A power sensor. Having measured the frequency the power reading could be automatically corrected.

Since the introduction of the HP8902A, it has become the norm for calibration factors to be uploaded automatically. And even though the HP8902A was very successful, automatic frequency-corrected power measurements have remained an uncommon feature. There may be a number of reasons for this: (1) The frequency determination has required a complex device (modulation receiver); (2) the resulting sensor package (HP11792A) was large and expensive; (3) in the case of the HP11792A, the switch was inclined to wear out over time; and (4) the need to constantly calibrate and zero the sensor minimized the advantage of automatic frequency determination.

In any event, the automatic application of calibration factors as a result of measuring frequency is not a novel idea. However, there have been ideas about how to measure the frequency more accurately. Most have often involved traditional approaches, such as frequency counters. These tend to have high accuracy and great resolution. Some include zero crossing detectors. However, these approaches have the following problems: (1) they tend to be slow; (2) they are very complex and expensive (usually as complex as the power meter itself); and (3) they are difficult to employ at low power and high frequency.

One important fact to understand when making frequency-corrected power measurements is that the frequency need not be measured with great precision—a good approximation is sufficient. For most purposes it is more than adequate if the frequency is known to within one percent (1%). Indeed, some approaches have recommended the use of frequency approximations.

At least one patent, U.S. Pat. No. 5,801,525, to Wiltron, seems to teach such an approach. The disclosed method has a few notable limitations: (1) Match is an important specification for any power sensor, and it is difficult to design filter that provides a broadband match to incoming signals (this would be problematic for power sensors); (2) while the filter is in the pass band it is difficult to reliably differentiate frequency based on level. Beyond the knee of the filter, sensitivity becomes a serious problem. These two limitations may make frequency determination too inaccurate in most cases, and simply impossible in some cases. This is because sensitivity varies with frequency (as previously mentioned), and as a result the usable power range is very limited. Next, as a practical matter greater frequency range (several decades) requires additional filters. Of course these will need to be switched in/out. This causes additional problems with match or reflection and complexity. In addition, if the switching is not conducted carefully, switching transients may be seen by the outside system. Further, as a practical matter it is necessary to employ one detector per filter. Each detector-filter pair must be calibrated as inferred by the patent. This results in an expensive and time consuming proposition since the filter-detector pair must be calibrated over power and temperature. And further still, the complexity of the firmware is greatly increased. In addition the time to make power measurements is increased. This is because it may be necessary to switch between all filters to determine the best signal level to use and then make the appropriate choice with respect to frequency.

Other approaches for determining frequency are common in literature related to the art. These include tuned notch filters, frequency discriminators and receivers. These approaches are either excessively complex, have very serious match problems, are unable to deal with a wide dynamic range, or suffers another fundamental limitation.

The foregoing patent and devices in the prior art reflect the current state of the art of which the present inventors are aware. Reference to, and discussion of, these patents is intended to aid in discharging Applicants' acknowledged duties of candor in disclosing information that may be relevant to the examination of claims to the present invention. However, it is respectfully submitted that none of the above-indicated patents disclose, teach, suggest, show, or otherwise render obvious, either singly or when considered in combination, the invention described and claimed herein.

BRIEF SUMMARY OF THE INVENTION

The self-balancing frequency determining bridge of the present invention generally employs a self-balancing Wheatstone bridge arrangement. In this bridge, one or more legs contain voltage tuned reactive elements. In most embodiments the tuned legs are shown as entirely reactive. The tuning is accomplished by detecting the voltage at opposite corners of the bridge. The voltages are then fed into a comparing function, generally provided by a low offset operational amplifier having a bandwidth dictated by the response of the system. The imbalance or error voltage is then amplified and employed in tuning the reactance of one or more leg.

While the general cases show two tunable branches, the simpler case (and preferred embodiment) uses one tunable leg, which is adequate for most purposes. There may also be circumstances in which a tuned leg contains both a reactive and tuned element.

In several preferred embodiments a number of microwave switches (including microwave FETs) may be employed to allow reactive legs to be switched in or out in order to cover a broader frequency range. Preferably the switched legs are positioned so that a resistive leg is between $RF_{in}$ and the switched leg. This provides some isolation from switching transients. In all cases this approach yields excellent match at the frequency of interest, very good frequency insensitivity, good frequency range, good dynamic range, is highly responsive (or as unresponsive as desired) and is relatively simple.

Terms and nomenclature relevant to a consideration of the elements of the present invention include:

$RF_{in}$—The primary signal input;

$V_{RF}$—The input at the junction to the node common to $Z_1$ and $Z_3$;

$Z_1$—impedance of the upper left leg of the bridge;

$Z_2$—impedance of the lower left leg of the bridge;

$Z_3$—impedance of the upper right leg of the bridge;

$Z_4$—this is the voltage tunable impedance and is the lower right leg of the bridge;

$V_B$—error or difference voltage across the bridge ($V_{D2}-V_{D1}$);

$V_{D1}$—the voltage at the junction of $Z_3$ and $Z_4$ passed to DET1;

$V_{D2}$—the voltage at the junction of $Z_1$ and $Z_2$ passed to DET2;

DET1—detects the RF voltage at the node common to $Z_3$ and $Z_4$, and the output of DET1 is connected to one of the COMP inputs;

DET2—detects the RF voltage at the node common to $Z_1$ and $Z_2$ and yields a voltage that is proportional to input power (the output of DET2 being connected to one of the COMP inputs);

COMP—a voltage comparator amplifier whose inputs are connected to the outputs of DET1 and DET1 (the output of COMP is the tune (TUNE) voltage used to balance the bridge by changing the impedance of $Z_4$. This is also FREQUENCY);

FREQUENCY—a voltage that is proportional to frequency, and one of two outputs of the system;

POWER—an output voltage proportional to power; a measurement uncorrected for frequency—the preferred embodiment employs log detectors so that POWER is proportional to the log (base 10) of the power in;

TUNE—this is the same as FREQUENCY and is used to change the value of $Z_4$; and GROUND—common to $Z_2$ and $Z_4$ and other elements in the system.

There has thus been broadly outlined the more important features of the invention in order that the detailed description that follows may be better understood, and in order that the present contribution to the art may be better appreciated. Additional objects, advantages and novel features of the invention will be set forth in part in the description as follows, and in part will become apparent to those skilled in the art upon examination of the following. Furthermore, such objects, advantages and features may be learned by practice of the invention, or may be realized and attained by means of the instrumentalities and combinations particularly pointed out in the appended claims.

Still other objects and advantages of the present invention will become readily apparent to those skilled in this art from the following detailed description, which shows and describes only the preferred embodiments of the invention, simply by way of illustration of the best mode now contemplated of carrying out the invention. As will be realized, the invention is capable of modification in various obvious respects without departing from the invention. Accordingly, the drawings and description of the preferred embodiment are to be regarded as illustrative in nature, and not as restrictive.

The foregoing summary broadly sets out the more important features of the present invention so that the detailed description that follows may be better understood, and so that the present contributions to the art may be better appreciated. There are additional features of the invention that will be described in the detailed description of the preferred embodiments of the invention which will form the subject matter of the claims appended hereto.

Accordingly, before explaining the preferred embodiment of the disclosure in detail, it is to be understood that the disclosure is not limited in its application to the details of the construction and the arrangements set forth in the following description or illustrated in the drawings. The inventive apparatus described herein is capable of other embodiments and of being practiced and carried out in various ways.

Also, it is to be understood that the terminology and phraseology employed herein are for descriptive purposes only, and not limitation. Where specific dimensional and material specifications have been included or omitted from the specification or the claims, or both, it is to be understood that the same are not to be incorporated into the appended claims.

As such, those skilled in the art will appreciate that the conception, upon which this disclosure is based may readily be used as a basis for designing other structures, methods, and systems for carrying out the several purposes of the present invention. It is important, therefore, that the claims are regarded as including such equivalent constructions as far as they do not depart from the spirit and scope of the present invention. Rather, the fundamental aspects of the invention, along with the various features and structures that characterize the invention, are pointed out with particularity in the claims annexed to and forming a part of this disclosure. For a better understanding of the present invention, its advantages and the specific objects attained by its uses, reference should be made to the accompanying drawings and descriptive matter in which there are illustrated the preferred embodiment.

BRIEF DESCRIPTION OF THE SEVERAL VIEWS OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Figure 1:
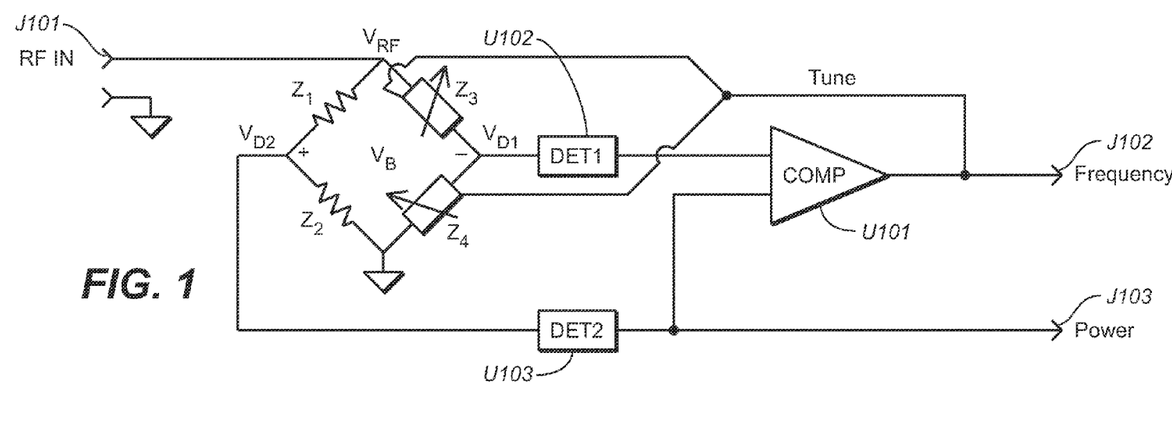
FIG. 1 is a schematic diagram showing a first preferred embodiment of the present invention.

Referring now to FIG. 1, there is shown a simplified schematic diagram of a first preferred embodiment of the present invention. In this embodiment, each side of a Wheatstone bridge provides impedance through voltage-controlled frequency-reactive elements $Z_2$ and $Z_4$, and non-reactive impedances $Z_1$ and $Z_2$ only, such as resistors. The junction of $Z_3$ and $Z_4$ are grounded in common with the ground used by RF input connection J101. A radio frequency (RF) input signal is applied to RF input connection J101. The RF input signal is passed from RF input connection J101 to the junction of $Z_1$ and $Z_3$ The junction of $Z_3$ and $Z_4$ is the input to detector U102, which then produces as its output a direct current (DC) voltage proportional to the power of the RF input signal. The output of detector U102 is coupled to one input of differential voltage comparator U101. Note that detector U102 is preferably implemented as a demodulating logarithmic amplifier, capable of accurately converting an RF input signal to a corresponding decibel-scaled output voltage.

Any of a number of well-known operational amplifiers may be used as a differential voltage comparator U101. Examples include the AD8675 made by Analog Devices of Norwood, Mass. Differential voltage comparator U101 is configured to accept into one of its inputs the DC voltage output of detector U102. The source of the other input to differential voltage comparator U101 is the DC voltage output of detector U103. The input provided by detector U103 is a consistent DC voltage as long as the RF input signal amplitude remains constant. Differential voltage comparator U101 provides an output voltage that is directly related to the difference in the voltages at its two inputs. The output of differential voltage comparator U101 is a voltage that is proportional to the frequency of the RF input signal. The output of differential voltage comparator U101 is sent to frequency measurement output J103.

The output of differential voltage comparator U101 is also the control voltage input of that tunes $Z_3$ and $Z_4$. This arrangement is used to feed back a control voltage for tuning both reactive elements of the Wheatstone bridge.

In the embodiment shown in FIG. 1, when an RF input signal is applied to RF input connection J101, detector U103 provides a consistent DC output voltage to its input to differential voltage comparator U101. At the same time, detector U102 provides a DC output voltage to its input to differential voltage comparator U101. Initially, the DC output voltage of detector U102 is not the same as that provided by detector U103. This is due to the frequency-related reactance of $Z_3$ and $Z_4$. Until the reactance of each of these elements is made equal at the frequency of the RF input signal, the amplitude of the RF signal fed into the input of detector U103 will not be the same as that being fed into the input of detector U102. For this reason, there will initially be a difference between the DC voltages being fed to the inputs of differential voltage comparator U101.

The initial difference between the DC voltages at the inputs of differential voltage comparator U101 causes the output voltage of differential voltage comparator U101 to vary. This output voltage is the control voltage applied to inputs of $Z_3$ and $Z_4$. This feedback control voltage tunes both reactive elements of the Wheatstone bridge, causing the amplitude of RF signal present at the junction of $Z_3$ and $Z_4$ to approach the amplitude of the RF signal present at the junction of $Z_1$ and $Z_2$. The result of this is that the DC voltage output from detector U102 approaches the DC voltage output from detector U103. When the DC voltage output of detector U102 is equal to the DC voltage output from detector U103, the Wheatstone bridge is balanced at the RF input signal's frequency. When the Wheatstone bridge is balanced, the output DC voltage of differential voltage comparator U101 is proportional to the frequency of the RF input signal.

Figure 2:
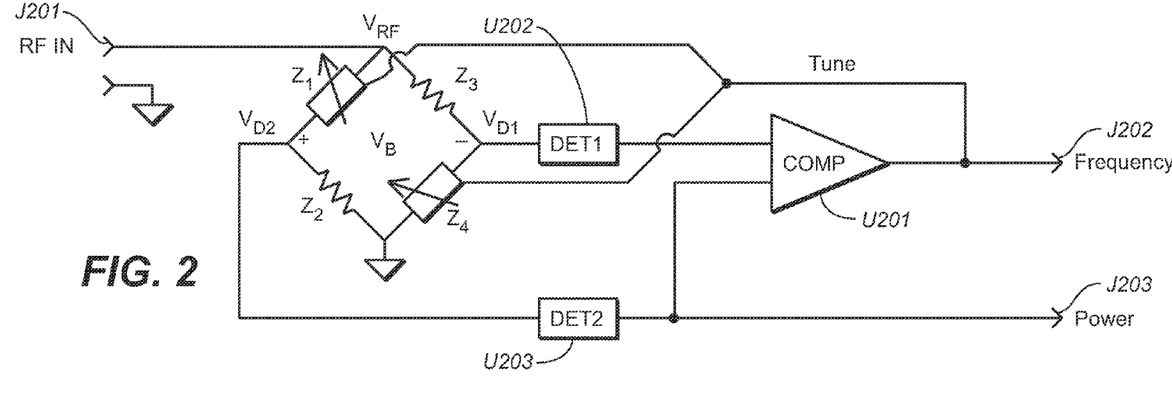
FIG. 2 is a schematic diagram showing a second preferred embodiment of the present invention.

Referring now to FIG. 2, a simplified schematic diagram of another possible embodiment of the present invention is shown. In this embodiment, each side of a Wheatstone bridge provides impedance through voltage-controlled frequency-reactive elements $Z_1$ and $Z_4$, and non-reactive impedance elements $Z_2$ and $Z_3$ only, such as resistors. The junction of $Z_2$ and $Z_4$ is grounded in common with the ground used by RF input connection J201. A radio frequency (RF) input signal is applied to RF input connection J201. The RF input signal is passed from RF input connection J201 to the junction of $Z_1$ and $Z_3$.

The junction of $Z_1$ and $Z_2$ acts as an input to detector U203. An impedance-divided version of the RF input signal is passed through this junction to the input of detector U203, which then produces as its output a direct current (DC) voltage proportional to the power level of the RF input signal. The output of detector U203 is coupled to one input of differential voltage comparator U201. The output of detector U203 is also coupled to power measurement output J203. Note that detector U203 is preferably implemented as a demodulating logarithmic amplifier, capable of accurately converting an RF input signal to a corresponding decibel-scaled output voltage.

The junction of $Z_3$ and $Z_4$ acts as an input to detector U202. An impedance-divided version of the RF input signal is passed through this junction to the input of detector U202, which then produces as its output a direct current (DC) voltage proportional to the power of the RF input signal. The output of detector U202 is coupled to one input of differential voltage comparator U201. Note that detector U202 is preferably implemented as a demodulating logarithmic amplifier, capable of accurately converting an RF input signal to a corresponding decibel-scaled output voltage.

Again, a well-known operational amplifier is used as a differential voltage comparator U201. Differential voltage comparator U201 is configured to accept into one of its inputs the DC voltage output of detector U202. The source of the other input to differential voltage comparator U201 is the DC voltage output of detector U203. The input provided by detector U203 is a consistent DC voltage as long as the RF input signal amplitude and frequency remain constant. Differential voltage comparator U201 provides an output voltage that is directly related to the difference in the voltages at its two inputs. The output of differential voltage comparator U201 is a voltage that is proportional to the frequency of the RF input signal. The output of differential voltage comparator U201 is sent to frequency measurement output J203.

The output of differential voltage comparator U201 is the control voltage inputs of $Z_1$ and $Z_4$. This arrangement is used to feed back a control voltage for tuning both reactive elements of the Wheatstone bridge.

In this second preferred embodiment of the inventive bridge, it can be assumed that the impedances of $Z_2$ and $Z_3$ are equal. When (at the frequency of the RF input signal) the impedance of $Z_1$ is equal to the impedance of $Z_3$, and the impedance of $Z_4$ is equal to the impedance of $Z_2$, the Wheatstone bridge is balanced.

As shown in FIG. 2, when an RF input signal is applied to RF input connection J201, detector U203 provides a DC output voltage to the input of differential voltage comparator U201. At the same time, detector U202 provides a DC output voltage to its input to differential voltage comparator U201. Initially, the DC output voltage of detector U202 is not the same as that provided by detector U203.

This is due to the frequency-related reactance of $Z_1$ and $Z_4$. Until the Wheatstone bridge is balanced, the amplitude of the RF signal fed into the input of detector U203 will not be the same as that being fed into the input of detector U202.

The initial difference between the DC voltages at the inputs of differential voltage comparator U201 causes the output voltage of differential voltage comparator U201 to vary. This output voltage is the control voltage applied to the inputs of $Z_1$ and $Z_4$. This feedback control voltage tunes both reactive elements of the Wheatstone bridge, causing the amplitude of RF signal present at the junction of $Z_3$ and $Z_4$ to approach the amplitude of the RF signal present at the junction of $Z_1$ and $Z_2$. The result of this is that the DC voltage output from detector U202 approaches the DC voltage output from detector U203. When the DC voltage output of detector U202 is equal to the DC voltage output from detector U203, the Wheatstone bridge is balanced at the RF input signal's frequency. When the Wheatstone bridge is balanced, the output DC voltage of differential voltage comparator U201 is proportional to the frequency of the RF input signal.

Figure 3:
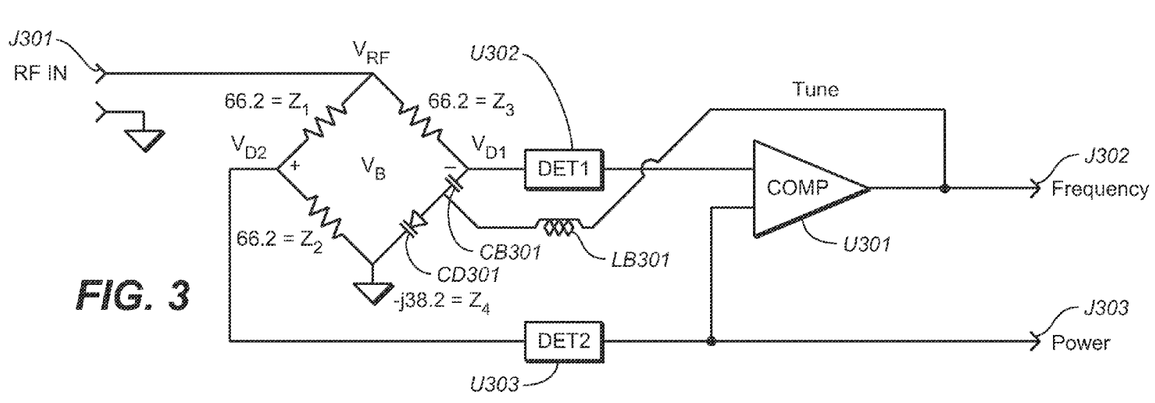
FIG. 3 is a schematic diagram showing a third preferred embodiment of the present invention.

Referring next to FIG. 3, there is shown a simplified schematic diagram of a third preferred embodiment of the present invention. In this embodiment, one side of a Wheatstone bridge provides impedance through a voltage-controlled frequency-reactive element $Z_4$, and non-reactive impedance elements $Z_1$, $Z_2$, and $Z_3$ such as resisters, comprise DC blocking capacitor CB301 and voltage-controlled varactor CD301.

The junction of $Z_2$ and $Z_4$ is grounded in common with the ground used by RF input connection J301. A radio frequency (RF) input signal is applied to RF input connection J301. The RF input signal is passed from RF input connection J301 to the junction of $Z_1$ and $Z_3$.

The junction of $Z_1$ and $Z_2$ is the input to detector U303. A voltage-divided version of the RF input signal is passed through this junction to the input of detector U303, which then produces as its output a direct current (DC) voltage proportional to the power level of the RF input signal. The output of detector U303 is coupled to one input of differential voltage comparator U301. The output of detector U303 is also coupled to power measurement output J303. Note that detector U303 is preferably implemented as a demodulating logarithmic amplifier, capable of accurately converting an RF input signal to a corresponding decibel-scaled output voltage.

The junction of $Z_3$ and $Z_4$ acts as an input to detector U302. An impedance-divided version of the RF input signal is passed through this junction to the input of detector U302, which then produces as its output a direct current (DC) voltage proportional to the power of the RF input signal. The output of detector U302 is coupled to one input of differential voltage comparator U301. Note that detector U302 is preferably implemented as a demodulating logarithmic amplifier, capable of accurately converting an RF input signal to a corresponding decibel-scaled output voltage.

An operational amplifier is used as differential voltage comparator U301. Differential voltage comparator U301 is configured to accept into one of its inputs the DC voltage output of detector U302. The source of the other input to differential voltage comparator U301 is the DC voltage output of detector U303. The input provided by detector U303 is a consistent DC voltage as long as the RF input signal amplitude remains constant. Differential voltage comparator U301 provides an output voltage that is directly related to the difference in the voltages at its two inputs. The output of differential voltage comparator U301 is a voltage that is proportional to the frequency of the RF input signal. The output of differential voltage comparator U301 is sent to frequency measurement output J303.

The output of differential voltage comparator U301 is also coupled to the control voltage input of varactor CD301 (part of $Z_4$). This arrangement is used to feed back a control voltage for tuning the reactive element of the Wheatstone bridge.

In the embodiment shown in FIG. 3, when an RF input signal is applied to RF input connection J301, detector U303 provides a consistent DC output voltage to its input to differential voltage comparator U301. At the same time, detector U302 provides a DC output voltage to its input to differential voltage comparator U301. Initially, the DC output voltage of detector U302 is not the same as that provided by detector U303. This is due to the frequency-related reactance of $Z_4$. Until the reactance of $Z_4$ is made equal (at the frequency of the RF input signal) to the impedance of $Z_2$, the amplitude of the RF signal fed into the input of detector U303 will not be the same as that being fed into the input of detector U302. For this reason, there will initially be a difference between the DC voltages being fed to the inputs of differential voltage comparator U301.

The initial difference between the DC voltages at the inputs of differential voltage comparator U301 causes the output voltage of differential voltage comparator U301 to vary. This output voltage is applied to the control voltage input of varactor CD301 (part of $Z_4$). This feedback control voltage tunes the reactive element of the Wheatstone bridge, causing the amplitude of RF signal present at the junction of $Z_3$ and $Z_4$ to approach the amplitude of the RF signal present at the junction of $Z_1$ and $Z_2$. The result of this is that the DC voltage output from detector U302 approaches the DC voltage output from detector U303. When the DC voltage output of detector U302 is equal to the DC voltage output from detector U303, the Wheatstone bridge is balanced at the RF input signal's frequency. When the Wheatstone bridge is balanced, the output DC voltage of differential voltage comparator U301 is proportional to the frequency of the RF input signal.

Figure 4:
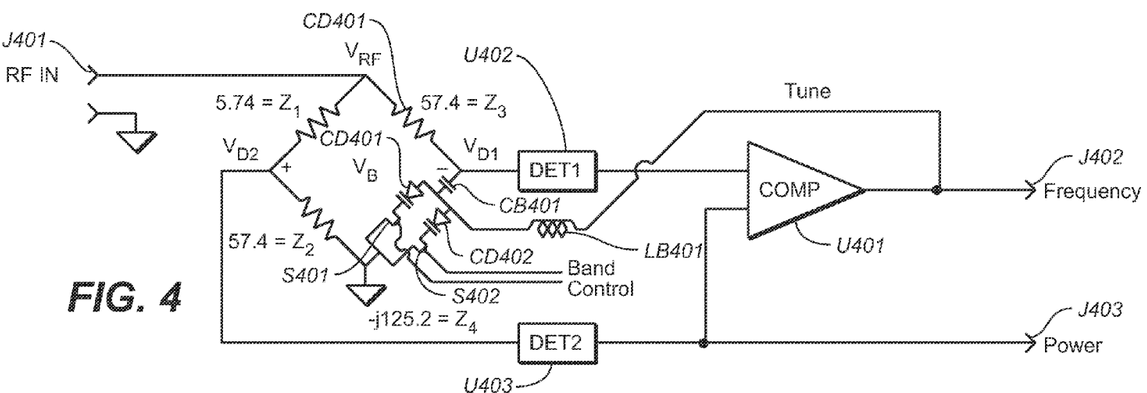
FIG. 4 is a schematic diagram showing a fourth preferred embodiment of the present invention.

Referring next to FIG. 4, a simplified schematic diagram of a fourth preferred embodiment of the present invention is shown. In the example provided in FIG. 4, the impedance value of each of the legs of the Wheatstone bridge is shown. In this example, the values are: Impedance $Z_1$=5.74; Impedance $Z_2$=57.4; Impedance $Z_3$=57.4; and Impedance $Z_4$=−j125.2.

In this embodiment, one side of a Wheatstone bridge provides impedance through a voltage-controlled frequency-reactive element $Z_4$ and a non-reactive impedance element $Z_3$ such as resistors. $Z_4$ comprises a DC blocking capacitor CB401 and the selectable voltage-controlled elements varactor CD401 and varactor CD402. The values of varactor CD401 and varactor CD402 differ such that each is reactive to different band of frequencies, and can be tuned across that band of frequencies. A set of band-control lines is used to control switches S401 and S402. Switches S401 and S402 are used to switch into the Wheatstone bridge circuit the varactor that is appropriate for the band of frequencies in which the frequency measurement is being made.

The other side of the Wheatstone bridge is composed of non-reactive impedances $Z_1$ and $Z_2$ only, such as resistors. The junction of $Z_2$ and $Z_4$ is grounded in common with the ground used by RF input connection J401. A radio frequency (RF) input signal is applied to RF input connection J401. The RF input signal is passed from RF input connection J401 to the junction of $Z_1$ and $Z_3$.

The junction of $Z_1$ and $Z_2$ acts as an input to detector U403. A voltage-divided version of the RF input signal is passed through this junction to the input of detector U403, which then produces as its output a direct current (DC) voltage proportional to the power level of the RF input signal. The output of detector U403 is coupled to one input of differential voltage comparator U401. The output of detector U403 is also coupled to power measurement output J403. Note that detector U403 is preferably implemented as a demodulating logarithmic amplifier, capable of accurately converting an RF input signal to a corresponding decibel-scaled output voltage.

The junction of $Z_3$ and $Z_4$ is the input to detector U402. An impedance-divided version of the RF input signal is passed through this junction to the input of detector U402, which then produces as its output a direct current (DC) voltage proportional to the power of the RF input signal. The output of detector U402 is coupled to one input of differential voltage comparator U401. Note that detector U402 is preferably implemented as a demodulating logarithmic amplifier, capable of accurately converting an RF input signal to a corresponding decibel-scaled output voltage.

An operational amplifier is used as differential voltage comparator U401. Differential voltage comparator U401 is configured to accept into one of its inputs the DC voltage output of detector U402. The source of the other input to differential voltage comparator U401 is the DC voltage output of detector U403. The input provided by detector U403 is a consistent DC voltage as long as the RF input signal amplitude remains constant. Differential voltage comparator U401 provides an output voltage that is directly related to the difference in the voltages at its two inputs. The output of differential voltage comparator U401 is a voltage that is proportional to the frequency of the RF input signal. The output of differential voltage comparator U401 is sent to frequency measurement output J403.

The output of differential voltage comparator U401 is also coupled through bias tee LB401 to the control voltage inputs of varactor CD401 and varactor CD402 (part of $Z_4$). This arrangement is used to feed back a control voltage for tuning the reactive element of the Wheatstone bridge.

In the embodiment shown in FIG. 4, when an RF input signal is applied to RF input connection J401, detector U403 provides a consistent DC output voltage to its input to differential voltage comparator U401. At the same time, detector U402 provides a DC output voltage to its input to differential voltage comparator U401. Initially, the DC output voltage of detector U402 is not the same as that provided by detector U403. This is due to the frequency-related reactance of $Z_4$. Until the reactance of $Z_4$ is made equal (at the frequency of the RF input signal) to the impedance of $Z_2$, the amplitude of the RF signal fed into the input of detector U403 will not be the same as that being fed into the input of detector U402. For this reason, there will initially be a difference between the DC voltages being fed to the inputs of differential voltage comparator U401.

The initial difference between the DC voltages at the inputs of differential voltage comparator U401 causes the output voltage of differential voltage comparator U401 to vary. This output voltage is applied to the control voltage input of varactor CD401 (part of $Z_4$). This feedback control voltage tunes the reactive element of the Wheatstone bridge, causing the amplitude of RF signal present at the junction of $Z_3$ and $Z_4$ to approach the amplitude of the RF signal present at the junction of $Z_1$ and $Z_2$. The result of this is that the DC voltage output from detector U402 approaches the DC voltage output from detector U403. When the DC voltage output of detector U402 is equal to the DC voltage output from detector U403, the Wheatstone bridge is balanced at the RF input signal's frequency. When the Wheatstone bridge is balanced, the output DC voltage of differential voltage comparator U401 is proportional to the frequency of the RF input signal.

Figure 5:
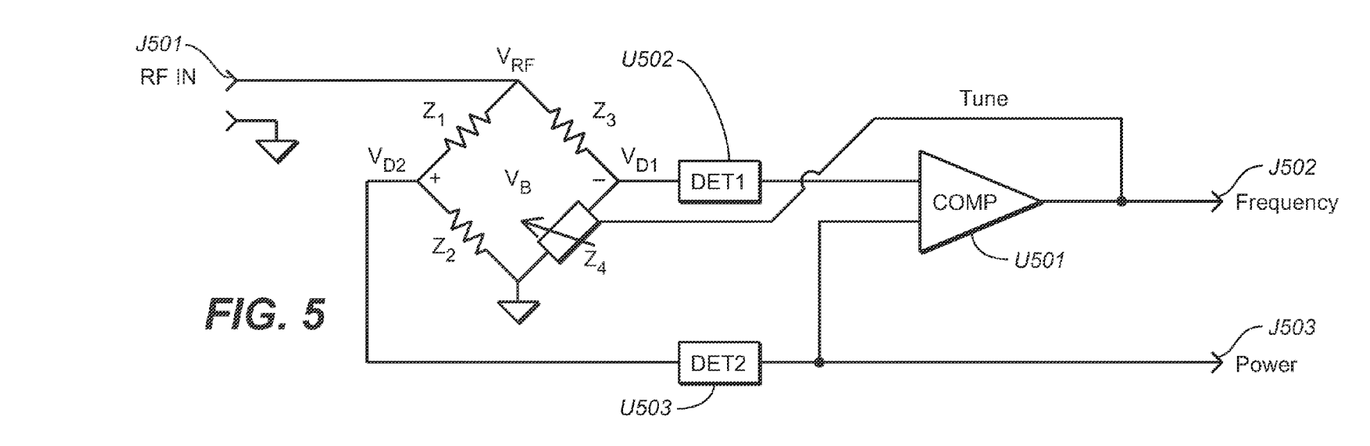
FIG. 5 is a schematic diagram showing a fifth preferred embodiment of the present invention.

Looking now at FIG. 5, a simplified schematic diagram of a fifth preferred embodiment of the present invention is shown. In this embodiment, Wheatstone bridge provides impedance through a voltage-controlled frequency-reactive element $Z_4$ and non-reactive impedance elements $Z_1$, $Z_2$, and $Z_3$. The junction of $Z_2$ and $Z_4$ is grounded in common with the ground used by RF input connection J501. A radio frequency (RF) input signal is applied to RF input connection J501. The RF input signal is passed from RF input connection J501 to the junction of $Z_1$ and $Z_3$.

The junction of $Z_1$ and $Z_2$ acts as an input to detector U503. A voltage-divided version of the RF input signal is passed through this junction to the input of detector U503, which then produces as its output a direct current (DC) voltage proportional to the power level of the RF input signal. The output of detector U503 is coupled to one input of differential voltage comparator U501. The output of detector U503 is also coupled to power measurement output J503. Note that detector U503 is preferably implemented as a demodulating logarithmic amplifier, capable of accurately converting an RF input signal to a corresponding decibel-scaled output voltage.

The junction of $Z_3$ and $Z_4$ acts as an input to detector U502. An impedance-divided version of the RF input signal is passed through this junction to the input of detector U502, which then produces as its output a direct current (DC) voltage proportional to the power of the RF input signal. The output of detector U502 is coupled to one input of differential voltage comparator U501. Note that detector U502 is preferably implemented as a demodulating logarithmic amplifier, capable of accurately converting an RF input signal to a corresponding decibel-scaled output voltage.

Once again, a well-known operational amplifier is used as differential voltage comparator U501. Differential voltage comparator U501 is configured to accept into one of its inputs the DC voltage output of detector U502. The source of the other input to differential voltage comparator U501 is the DC voltage output of detector U503. The input provided by detector U503 is a consistent DC voltage as long as the RF input signal amplitude remains constant. Differential voltage comparator U501 provides an output voltage that is directly related to the difference in the voltages at its two inputs. The output of differential voltage comparator U501 is a voltage that is proportional to the frequency of the RF input signal. The output of differential voltage comparator U501 is sent to frequency measurement output J503.

The output of differential voltage comparator U501 is also coupled to the control voltage input of $Z_4$. This arrangement is used to feed back a control voltage for tuning the reactive element of the Wheatstone bridge.

In the embodiment shown in FIG. 5, when an RF input signal is applied to RF input connection J501, detector U503 provides a consistent DC output voltage to its input to differential voltage comparator U501. At the same time, detector U502 provides a DC output voltage to its input to differential voltage comparator U501. Initially, the DC output voltage of detector U502 is not the same as that provided by detector U503. This is due to the frequency-related reactance of $Z_4$. Until the reactance of $Z_4$ is made equal (at the frequency of the RF input signal) to the impedance of $Z_2$, the amplitude of the RF signal fed into the input of detector U503 will not be the same as that being fed into the input of detector U502. For this reason, there will initially be a difference between the DC voltages being fed to the inputs of differential voltage comparator U501.

The initial difference between the DC voltages at the inputs of differential voltage comparator U501 causes the output voltage of differential voltage comparator U501 to vary. This output voltage is applied to the control voltage input of $Z_4$. This feedback control voltage tunes the reactive element of the Wheatstone bridge, causing the amplitude of RF signal present at the junction of $Z_3$ and $Z_4$ to approach the amplitude of the RF signal present at the junction of $Z_1$ and $Z_2$. The result of this is that the DC voltage output from detector U502 approaches the DC voltage output from detector U503. When the DC voltage output of detector U502 is equal to the DC voltage output from detector U503, the Wheatstone bridge is balanced at the RF input signal's frequency. When the Wheatstone bridge is balanced, the output DC voltage of differential voltage comparator U501 is proportional to the frequency of the RF input signal.

Figure 6:
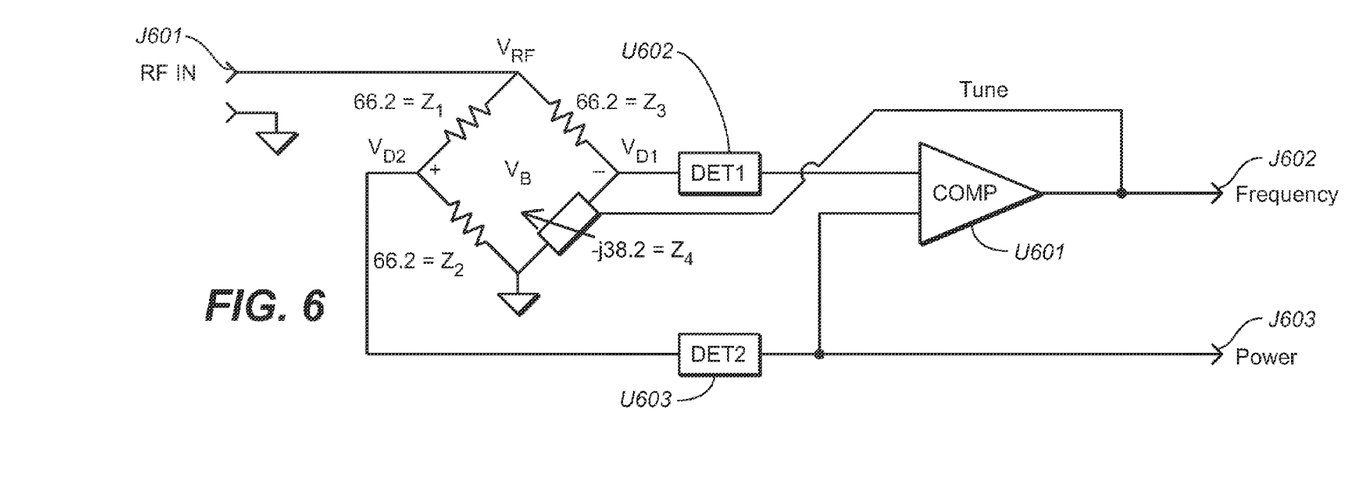
FIG. 6 is a schematic diagram showing a sixth preferred embodiment of the present invention.

Referring now to FIG. 6, a simplified schematic diagram of a sixth preferred embodiment of the present invention is shown. In the example provided in FIG. 6, the impedance value of each of the legs of the Wheatstone bridge is shown. In this example, the values are: Impedance $Z_1$=66.2; Impedance $Z_2$=66.2; Impedance $Z_3$=66.2; and Impedance $Z_4$=−j38.2.

The embodiment shown in FIG. 6 operates exactly the same as the embodiment described in FIG. 5. Comparable circuit elements are given reference numbers corresponding to this sixth preferred embodiment.

Figure 7:
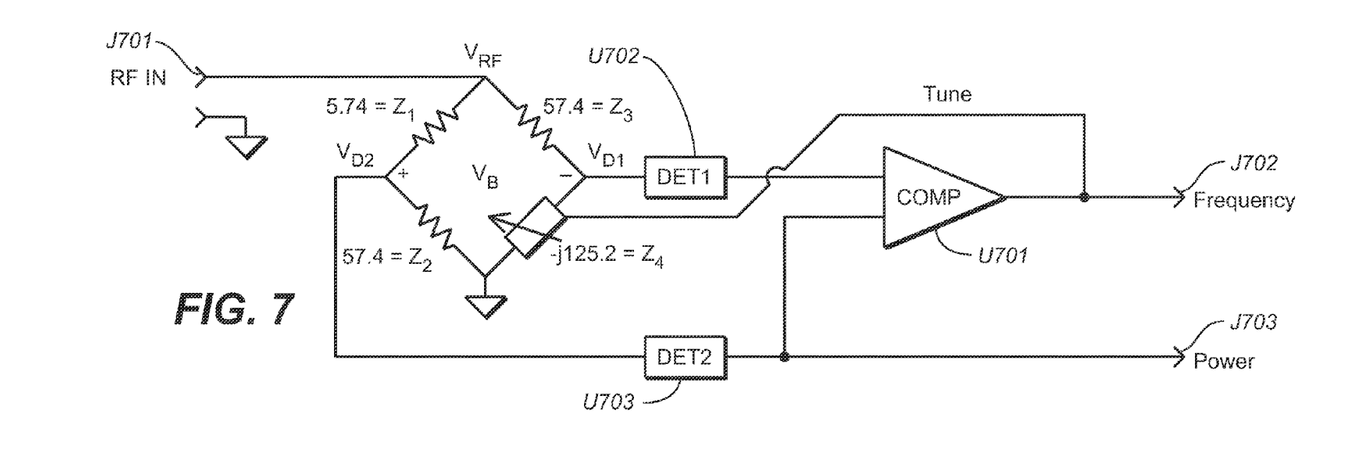
FIG. 7 is a schematic diagram showing a seventh preferred embodiment of the present invention.

Referring now to FIG. 7, a simplified schematic diagram of a seventh preferred embodiment of the present invention is shown. In the example provided in FIG. 7, the impedance value of each of the legs of the Wheatstone bridge is shown. In this example, the values are: Impedance $Z_1$=5.74; Impedance $Z_2$=57.4; Impedance $Z_3$=57.4; and Impedance $Z_4$=−j125.2.

Figure 9:
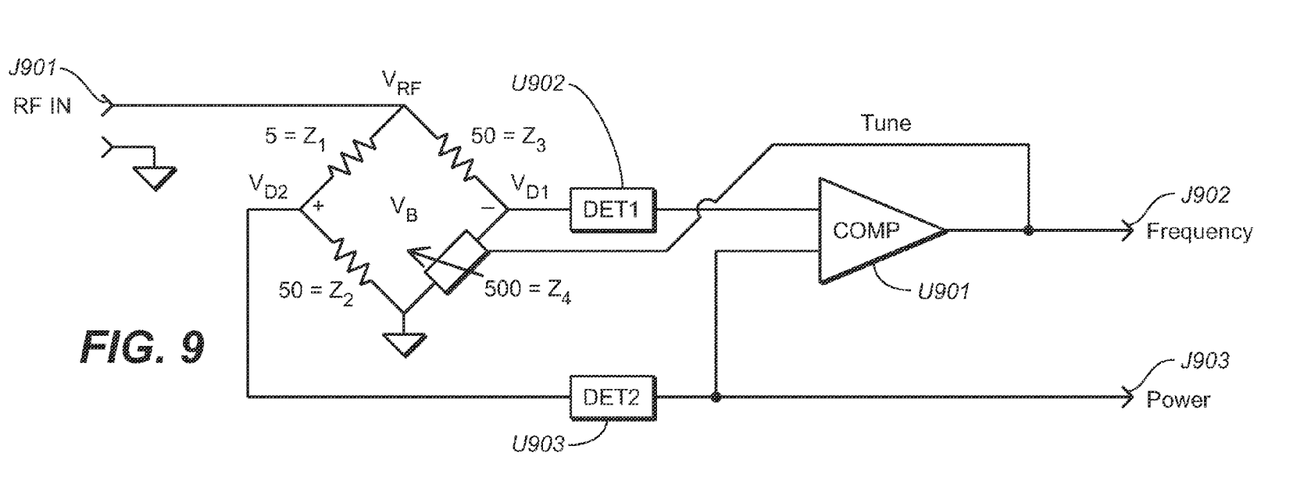
FIG. 9 is a schematic diagram showing a ninth preferred embodiment of the present invention.

The embodiment shown in FIG. 9 operates exactly the same as the embodiment described in FIG. 7. Comparable circuit elements are given reference numbers corresponding to this seventh preferred embodiment.

Figure 8:
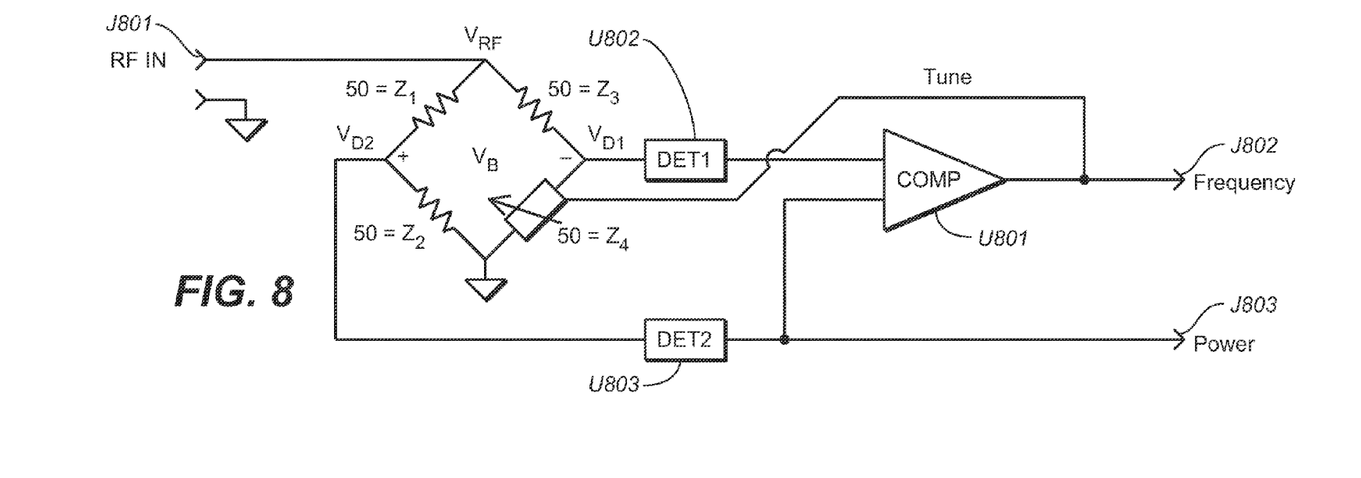
FIG. 8 is a schematic diagram showing a eighth preferred embodiment of the present invention.

Referring now to FIG. 8, a simplified schematic diagram of one embodiment of the present invention is shown. In the example provided in FIG. 8, the impedance value of each of the legs of the Wheatstone bridge is shown. In this example, the values are: Impedance $Z_1$=50; Impedance $Z_2$=50; Impedance $Z_3$=50; and Impedance $Z_4$=50.

The embodiment shown in FIG. 8 operates exactly the same as the embodiment described in FIG. 5. Comparable circuit elements are given reference numbers corresponding to this eighth preferred embodiment.

Referring now to FIG. 9, a simplified schematic diagram of one embodiment of the present invention is shown. In the example provided in FIG. 9, the impedance value of each of the legs of the Wheatstone bridge is shown. In this example, the values are: Impedance $Z_1$=5; Impedance $Z_2$=50; Impedance $Z_3$=50; and Impedance $Z_4$=500.

The embodiment shown in FIG. 9 operates exactly the same as the embodiment described in FIG. 5. Comparable circuit elements are given reference numbers corresponding to this ninth preferred embodiment.

Figure 10:
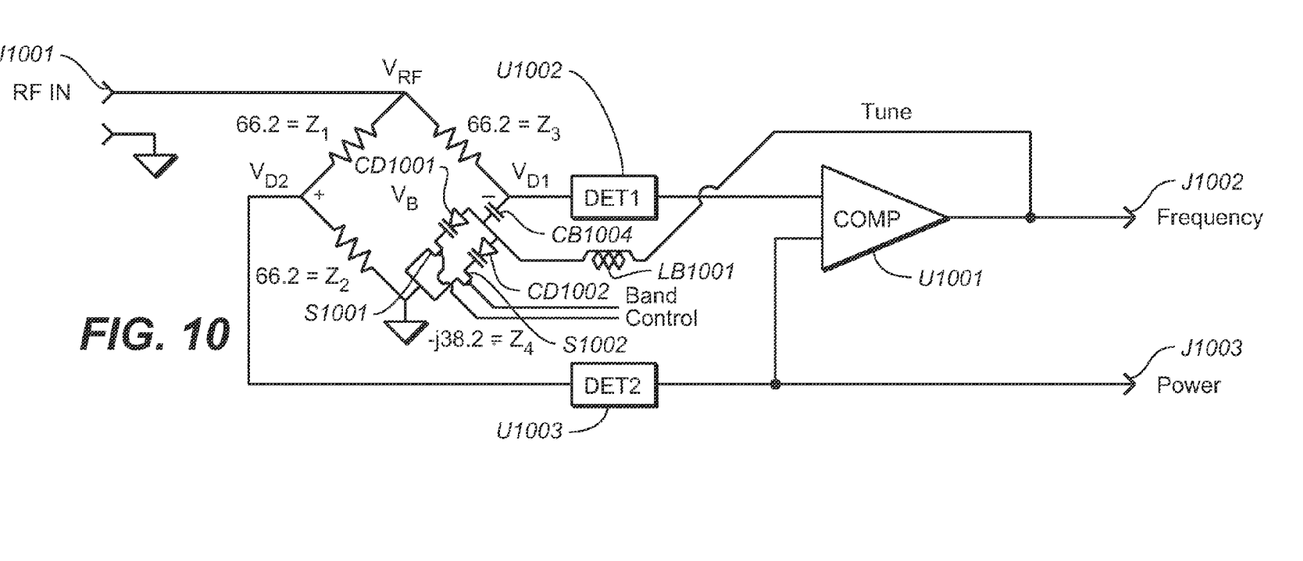
FIG. 10 is a schematic diagram showing a tenth preferred embodiment of the present invention.

Referring now to FIG. 10, a simplified schematic diagram of one embodiment of the present invention is shown. In the example provided in FIG. 10, the impedance value of each of the legs of the Wheatstone bridge is shown. In this example, the values are: Impedance $Z_1$=66.2; Impedance $Z_2$=66.2; Impedance $Z_3$=66.2; and Impedance $Z_4$=−j38.2.

The embodiment shown in FIG. 10 operates exactly the same as the embodiment described in FIG. 4. Comparable circuit element are given reference numbers corresponding to this tenth preferred embodiment.

Figure 11:
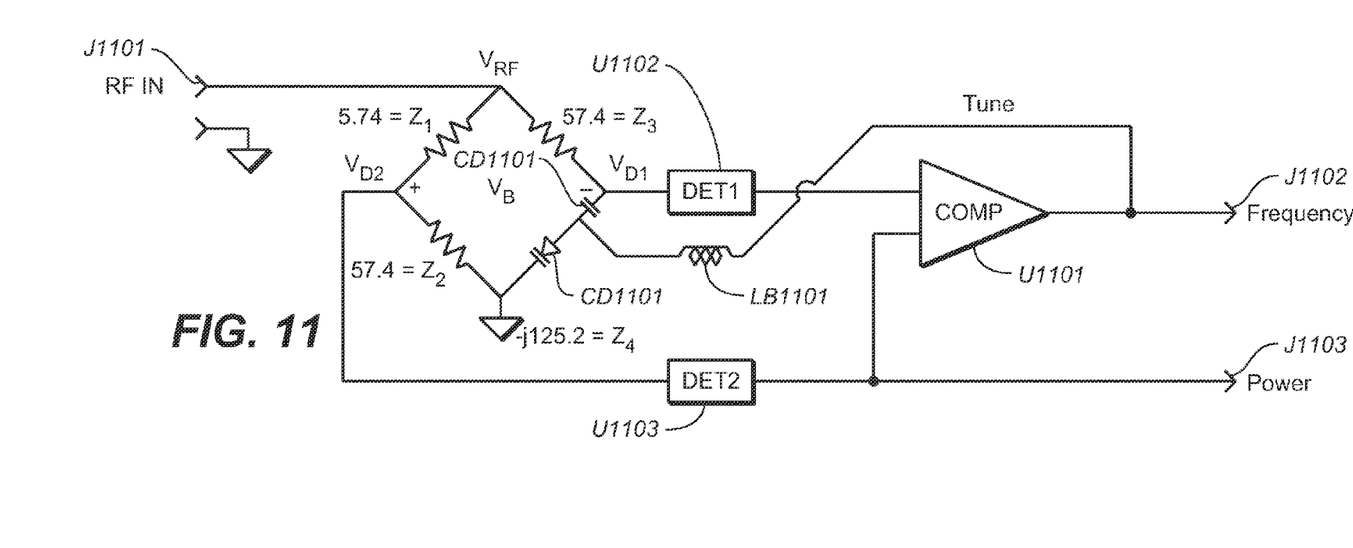
FIG. 11 is a schematic diagram showing a eleventh preferred embodiment of the present invention.

Referring now to FIG. 11, a simplified schematic diagram of one embodiment of the present invention is shown. In the example provided in FIG. 11, the impedance value of each of the legs of the Wheatstone bridge is shown. In this example, the values are: Impedance $Z_1$=5.74; Impedance $Z_2$=57.4; Impedance $Z_3$=57.4; and Impedance $Z_4$=−j125.2.

The embodiment shown in FIG. 11 operates exactly the same as the embodiment described in FIG. 3. Comparable circuit elements are given reference numbers corresponding to this eleventh preferred embodiment.

Referring once again to FIG. 3, it will be appreciated that the input to the system is the value to be measured for $RF_{IN}$. The outputs of the system are FREQUENCY J302 and POWER J303. The balancing of the bridge is accomplished through a voltage labeled TUNE.

Clearly, the TUNE voltage of COMP must be isolated from the RF input. This can be done using one of a number of common techniques. The first and most obvious is to use a RF choke or bias tee as shown between COMP output and $Z_4$ input. Additional DC isolation must be provided between $z_4$ and the other elements in the bridge. This is most easily accomplished by using blocking capacitors.

As the frequency of $RF_{in}$ varies, the detected RF voltage between and $z_1$ and $Z_2$ remains constant (ignoring reflections). However, since $Z_4$ is reactive the detected RF voltage at the junction of $Z_3$ and $Z_4$ varies. This results in a difference voltage or imbalance detected by COMP that is a function of frequency. COMP then provides a tune voltage, proportional to frequency. This voltage is used to tune $Z_4$. In the preferred embodiment, $Z_4$ is a voltage tuned reactive element.

If COMP has adequate gain, $Z_4$ is tuned so that its impedance balances the bridge. In this case, the magnitude of $V_{D1}$ and $V_{D2}$ are equal. COMP should be selected according to accepted electrical engineering concepts, such as loop gain and loop margin. Also some attention should be directed to offset voltage and the size of the error or difference voltage.

The preferred embodiments employ a log detector; specifically, the AD8318 from Analog Device Inc. As with most log detectors, the AD8318 provides relatively large changes in voltage for small changes in power at low power levels. This makes the loop dynamics easier to manage.

However, if one chooses traditional detectors, in which the output is proportional to input power in watts, it may be necessary to interpose an integrator between COMP and $Z_4$. This is a result of the small error voltages or imbalances in the bridge at lower power levels. As a result, gain will need to be increased to balance the bridge. Also, the offset voltage of COMP will become a larger factor.

The feedback voltage from COMP is adjusted until the detected voltage from DET1 and DET2 are equal. In the preferred embodiment $Z_1$, $Z_2$ and $Z_3$ are about 66.2 ohms. $Z_4$ is tuned to about $-j38.2$ ohms. In the preferred embodiment $Z_4$ should be selected so that this impedance is achievable for the frequency range of interest. This will have some impact on the selection of COMP and the power supply voltages.

The preferred embodiment provides a 50 ohm match at the frequency of interest. A less perfect match is made at frequencies away from the frequency of interest. Adjusting the values of $Z_1 \ldots Z_4$ can provide a range of compromises more appropriate for other situations and requirements.

The impedance seen by the incoming signal is a function of the bridge. The impedance of the bridge can be approximated by assuming the detector impedances are very large, and therefore ignored. This means the bridge can be modeled as series combination of $Z_1$ and $Z_2$ in parallel with the series impedances $Z_3$ and $Z_4$.

Given a desired input impedance (say 50 ohms) the following equations can be used to calculate the approximate values for $Z_1$, $Z_2$, $Z_3$ and $Z_4$. Given other requirements the equations may be varied.

Assume (preferred embodiment) $Z_1 = Z_2 = Z_3$     1

Assume $Z_1$, $Z_2$ and $Z_3$ are resistive so $Z_1 = Z_2 = Z_3 = R$     2

Assume $Z_4$ is capacitive so that $Z_4 = Xc = -j(1/(2\Pi fc))$     3

Modeling the series impedance of $Z_1$ and $Z_2$ in parallel with series impedance of $Z_3$ and $Z_4$:

$$Z_{RF} = (Z_1 + Z_2) \| (Z_3 + Z_4) \text{ or}$$

$$Z_{RF} = ((Z_1+Z_2)*(Z_3+Z_4))/((Z_1+Z_2)+(Z_3+Z_4))$$

$$Z_{RF} = ((Z_1+Z_2)*(Z_3+Z_4))/((Z_1+Z_2)+(Z_3+Z_4)) \quad 4$$

Substituting equation 2 into equation 4

$$Z_{RF} = ((R+R)*(R+Z_4))/((R+R)+(R+Z_4)) \quad 5$$

The error voltage VB is equal to:

$$V_B = V_{RF}*[[Z_2/(Z_1+Z_2)]-[Z_4/(Z_3+Z_4)]] \quad 6$$

Substituting equation 2 into equation 6

$$V_B = V_{RF}*[[R/(R+R)]-[Z_4/(R+Z_4)]] \text{ or}$$

Let $Z_4 = Xc$ and substitute $$V_B = V_{RF}*[1/2 - Xc/(R^2+Xc^2)^{1/2}] \quad 7$$

When the bridge is balanced then $V_B = 0$. At this point $V_{RF}$ becomes a constant and can be equated to 1 ... dropping out of the equation.

$$V_B = 0 = 1/2 - Xc/(R^2+Xc^2)^{1/2}$$

So that $$1/2 = Xc/(R^2+Xc^2)^{1/2}$$

$$R^2 + Xc^2 = 4Xc^2$$

$$R^2 = 3Xc^2$$

$$R = 3^{1/2}*Xc \quad 8$$

Or solving for Xc:

$$Xc = R/3^{1/2} \quad 9$$

Since $Z_4$ is a varactor the following equation applies:

$$C = K_{vr}/V_{tune} \text{ or } K_{vr}/\text{TUNE} \quad 10$$

Where $K_{vr}$ is a constant or function defining the relationship of the capacitance to voltage. Substituting equations 3 and 10 into equation 8, $$R = 3^{1/2}*V_{tune}/(2\Pi f K_{vr}) \quad 11$$

Where f=frequency of the incoming signal and $\Pi$=Pi. Solving 11 for frequency or f $$f = V_{tune}*[3^{1/2}/(2\Pi R K vr)] \quad 12$$

or $$f = \text{TUNE}*[3^{1/2}/(2\Pi R K vr)] \quad 13$$

It will be seen from equations 11 through 13 that the tune voltage will keep the bridge balanced over the range for which TUNE can adjust the value of Xc. Returning to equation 5 and simplifying:

$$Z_{RF} = (2R*(R+Z_4))/(3R+Z_4)) \quad 14$$

Substituting equation 3 into equation 14, $$Z_{RF} = (2R*(R-j(1/(2\Pi fc))))/(3R-j(1/(2\Pi fc))) \quad 15$$

Substituting equation 9 into equation 15, $$Z_{RF} = (2R*(R-j(R/3^{1/2})))/(3R-jR/3^{1/2})) \quad 16$$

Pulling R out of the top and bottom of equation 16, $$Z_{RF} = R*(2-j2/3^{1/2})/(3-j1/3^{1/2}) \quad 17$$

Multiplying the top and bottom by the square root of 3, $$Z_{RF} = R*(2*3^{1/2}-j2)/(3*3^{1/2}-j) \quad 18$$

$$R/Z_{RF} = (3*3^{1/2}-j)/(2*3^{1/2}-j2) \quad 19$$

$$R/Z_{RF} = 1.32 \quad 20$$

For many RF and microwave systems and for the preferred embodiment:

$$Z_{RF} = 50 \text{ ohms}$$

Then from equation 20,

R=66.2 ohms     21

Clearly any number of ratios for $Z_1$, $Z_2$, $Z_3$ and $Z_4$ will work. Some of these ratios can be quite varied and carry certain advantages. An engineer might consider other ratios if interested in minimizing the reflection in the event of the varactor shorting or opening. To solve this analytically one would construct equations assuming that the varactor was shorted and opened and then setting the equations equal.

In manipulating these equations it is convenient and reasonable to assume a ratio equating $Z_2$ to $Z_3$. As it turns out, a common ratio for bridges in RF work is to allow $Z_1=5$, $Z_2=50$, $Z_3=50$ and $Z_4=500$, as shown in FIG. 4, which illustrates a second preferred embodiment of the present invention. This ratio provides a reasonable first cut solution to this problem:

Let $Z_2=10*Z_1$

Let $Z_2=Z_3$

Let $Z_1=R$. So then $$Z_2/(Z_2+Z_3)=10R/11R=10/11 \quad (22)$$

For the balanced case:

$V_B=0$ so that $$Xc/(Z_3^2+Xc^2)^2=Z_2/(Z_2+Z_3)=10/11 \quad (23)$$

Substituting R for $Z_3$ we obtain:

$$Xc/(R^2+Xc^2)^2=10/11 \quad (24)$$

Simplifying and gathering terms we get:

$$21\,Xc^2=100\,R^2 \quad (25)$$

$$R=(21/100)^{1/2}Xc \quad (26)$$

$$R=0.458\,Xc \quad (27)$$

We can now write the equation for $Z_{RF}$ as we did before assuming that the impedance of the detectors is inconsequential (although for this case it is less true).

$$Z_{RF}=((Z_1+Z_2)*(Z_3+Z_4))/((Z_1+Z_2)+(Z_3+Z_4)) \quad (28)$$

Assume for this case $Z_1=Z_2/10$ and $Z_2=Z_3$. We'll also let $Z_2=R$. So we can rewrite the equation as:

$$Z_{RF}=((R/10+R)*(R-jXc))/(R/10+2R-jXc) \quad (29)$$

$$Z_{RF}=1.1R*(R-jXc)/(2.1R-jXc) \quad (30)$$

$$Z_{RF}=R*[(1.1(21^{1/2}-j10)]/[21^{1/2}-j10] \quad (31)$$

Solving for the ratio of the magnitudes:

$$R/Z_{RF}=1.147 \quad (32)$$

Assuming $Z_{RF}=50$ then $R=57.35$ and $\quad (33)$ $Z_1=57.35/10=5.735$ ohms $Z_2=Z_3=57.37$ And from equation 27

$Xc=125.21 \quad (34)$

We now analyze the benefit associated with this embodiment. As previously stated, this embodiment provides reasonable match when the voltage tuned reactance fails as either an open or short. The calculations for these failure modes are as follows:

$Z_4$=Open

So that $Z_{RF}=Z_1+Z_2$

... and the characteristic impedance $Z_0=50$ ohms

So that the reflection coefficient in this case is $\rho=((Z_1+Z_2)-Z_0)/((Z_1+Z_2)+Z_0)$ $\rho=((5.735+57.35)-50)/((5.735+57.35)+50)$ $\rho=0.1161$ This results in a return loss of −18.7 dB and a VSWR of about 1.26. These numbers are very good for a failed system. On the other hand if $Z_4$ is shorted the following calculations apply:

$Z_4=0$ ohms

So that $Z_{RF}=Z_1+Z_2\|Z_3$ $Z_{RF}=((5.735+57.35)(57.35))/(5.735+57.35+57.35)$ $Z_{RF}=30.04$ ohms ... and the characteristic impedance $Z_0=50$ ohms So that the reflection coefficient in this case is $\rho=((30)-Z_0)/(30)+Z_0)$ $\rho=((30)-50)/((30)+50)$ $\rho=0.250$ This yields a return loss of −12.0 dB and a VSWR of about 1.66. While these numbers are not as good as the previous numbers, they are not overly objectionable for a failed system. With some algebraic manipulation more balanced failure modes can be derived.

Having fully described several embodiments of the present invention, many other equivalents and alternative embodiments will be apparent to those skilled in the art. These and other equivalents and alternatives are intended to be included within the scope of the present invention.

What is claimed as invention is:

1. A self-balancing frequency determining bridge having one radio frequency input ($RF_{IN}$) and first and second outputs, wherein said first output has a voltage proportional to the magnitude of power of said $RF_{IN}$, and said second output has a voltage proportional to the frequency of said $RF_{IN}$, at least one differential voltage comparator, said differential voltage comparator having first and second inputs and a comparator output;

first and second RF detectors, each having an input and an output, wherein said output of said first RF detector goes to said first input of said differential voltage comparator, and said output of said second RF detector goes to said second input of said differential voltage comparator; and first through fourth nodes, and first through fourth impedances;

wherein said first node joins said $RF_{IN}$, said first impedance and said third impedance;

wherein said second node joins said first impedance, said second impedance, and said input of said second RF detector;

wherein said third node joins said third impedance, said fourth impedance, and said input of said first RF detector;

wherein said fourth node connects said second impedance, said fourth impedance, and ground;

wherein the output of said first RF detector is said first output, and the output of said second RF detector is said second output, and wherein said third and fourth impedances are tunable.

2. The self-balancing frequency-determining bridge of claim 1, wherein said fourth impedance is a voltage controlled frequency-reactive element comprising a DC blocking capacitor and a voltage-controlled varactor, and wherein said first through third impedances are non-reactive.

3. The self-balancing frequency-determining bridge of claim 1, wherein said fourth impedance includes first and second selectable voltage-controlled varactors, each being reactive to and tunable across different bands of frequencies, and each including band-control lines for controlling first and second switches, said switches used for switching into the bridge circuit one of said first and said second varactors depending on which is appropriate for the band of frequencies in which the frequency measurement is being made.

4. The self-balancing frequency-determining bridge of claim 1, wherein said third and fourth impedances are each configured as either reactive only, series reactive and resistive, parallel resistive and reactive, switched reactive, or switched parallel and/or series reactive and resistive, and wherein said comparator output of said differential voltage comparator connects to, and controls the reactance of, at least one of said tunable third and fourth impedances.

5. The self-balancing frequency-determining bridge of claim 4, wherein the reactance of at least one of said tunable third and fourth impedances is controlled by said comparator output in a manner that provides a desirable combination of input impedance match, frequency insensitivity, dynamic input power and frequency range, and frequency measurement representation accuracy.

6. A self-balancing frequency determining bridge having one radio frequency input ($RF_{IN}$) and first and second outputs, wherein said first output has a voltage proportional to the magnitude of power of said $RF_{IN}$, and said second output has a voltage proportional to the frequency of said $RF_{IN}$;
at least one differential voltage comparator, said differential voltage comparator having first and second inputs and a comparator output;
first and second RF detectors, each having an input and an output, wherein said output of said first RF detector goes to said first input of said differential voltage comparator, and said output of said second RF detector goes to said second input of said differential voltage comparator; and
first through fourth nodes, and first through fourth impedances;
wherein said first node joins said $RF_{IN}$, said first impedance and said third impedance;
wherein said second node joins said first impedance, said second impedance, and said input of said second RF detector;
wherein said third node joins said third impedance, said fourth impedance, and said input of said first RF detector;
wherein said fourth node connects said second impedance, said fourth impedance, and ground;
wherein the output of said first RF detector is said first output, and the output of said second RF detector is said second output, and
wherein said first and fourth impedances are tunable.

7. The self-balancing frequency-determining bridge of claim 6, wherein said first and fourth impedances are each configured as either reactive only, series reactive and resistive, parallel resistive and reactive, switched reactive, or switched parallel and/or series reactive and resistive, and wherein said comparator output of said differential voltage comparator connects to, and controls the reactance of, at least one of said tunable third and fourth impedances.

8. The self-balancing frequency-determining bridge of claim 7, wherein the reactance of at least one of said tunable first and fourth impedances is controlled by said comparator output in a manner that provides a desirable combination of input impedance match, frequency insensitivity, dynamic input power and frequency range, and frequency measurement representation accuracy.

\* \* \* \* \*